(12) United States Patent
Yen et al.

(10) Patent No.: US 7,403,046 B2
(45) Date of Patent: Jul. 22, 2008

(54) SAMPLE-AND-HOLD CIRCUITS

(75) Inventors: Chih-Jen Yen, Hsinchu (TW); Chih-Hsin Hsu, Hsinchu (TW)

(73) Assignee: Novatek Microelectronics Corp., Hsinchu (TW)

(*) Notice: Subject to any disclaimer, the term of this patent is extended or adjusted under 35 U.S.C. 154(b) by 17 days.

(21) Appl. No.: 11/161,433

(22) Filed: Aug. 3, 2005

(65) Prior Publication Data

US 2006/0202722 A1 Sep. 14, 2006

(30) Foreign Application Priority Data

Mar. 10, 2005 (TW) .............................. 94107261 A

(51) Int. Cl.
*G11C 27/02* (2006.01)
*H03K 5/00* (2006.01)
*H03K 17/00* (2006.01)

(52) U.S. Cl. .......................................... 327/95; 327/96
(58) Field of Classification Search .................. 327/91, 327/94–96, 337; 341/122
See application file for complete search history.

(56) References Cited

U.S. PATENT DOCUMENTS

| | | | | |
|---|---|---|---|---|
| 3,390,347 A | * | 6/1968 | Jones et al. ..................... | 330/51 |
| 5,239,210 A | * | 8/1993 | Scott ............................. | 327/63 |
| 5,389,833 A | * | 2/1995 | Kay ............................... | 327/96 |
| 5,481,212 A | * | 1/1996 | Shima ........................... | 327/94 |
| 5,965,958 A | * | 10/1999 | Harwood ...................... | 307/125 |
| 6,654,469 B1 | * | 11/2003 | Nelson et al. ................. | 381/94.1 |

FOREIGN PATENT DOCUMENTS

JP 10-21696 1/1998

* cited by examiner

*Primary Examiner*—Quan Tra
(74) *Attorney, Agent, or Firm*—Jianq Chyun IP Office

(57) ABSTRACT

A sample-and-hold circuit including a first switch, a first capacitor and an amplifier is provided. The switch has a first terminal to receive the input signal and transmit it to a second terminal thereof in the sample period. The first terminal of the first capacitor couples to the second terminal of the first switch, and the second terminal of the first capacitor couples to a first voltage for storing the sampling result of the input signal. The amplifier couples to the second terminal of the first switch, wherein the amplifier is disabled in the sample period, and the amplifier is enabled to generate the output signal according to the sampling result in the hold period.

40 Claims, 11 Drawing Sheets

US 7,403,046 B2

SAMPLE-AND-HOLD CIRCUITS

CROSS-REFERENCE TO RELATED APPLICATION

This application claims the priority benefit of Taiwan application serial no. 94107261, filed on Mar. 10, 2005. All disclosure of the Taiwan application is incorporated herein by reference.

BACKGROUND OF THE INVENTION

1. Field of the Invention

This invention generally relates to a signal sample and hold circuit, and especially to a sample and hold circuit, which prevents sample distortion caused by charge distribution effect.

2. Description of Related Art

A conventional circuit structure of sampling and holding information is shown in FIG. 1, wherein an operational amplifier 103 for example includes an input stage 104 and an output stage 105. In a sample period, a switch 101 is conducted and a switch 102 is un-conducted, meanwhile an input signal $V_{in}$ is stored in a capacitor 106. Therefore the voltage at node N1 is $V_{in}$, and the capacitor 106 stores a charge amount of C1. In a hold period, the switch 101 is un-conducted and the switch 102 is conducted, therefore, owing to the charge distribution effect, a portion of charges stored in the capacitor 106 flowing to a parasitic capacitor, represented by Cp1, between a gate electrode of a positive input terminal of the input stage 104 and ground. It means that a voltage at node N2 equals to $C_1 V_{in}/(C_1+Cp_1)$. Therefore, the voltage level of the output signal $V_{out}$ of the operational amplifier 103 will become $C_1 V_{in}/(C_1+Cp_1)$ rather than the voltage level $V_{in}$ of the previous sample due to the charge distribution effect.

Another conventional sample and hold circuit is shown as FIG. 2, including a plurality of switches 201 to 204, a plurality of sample capacitors 205 and 206, and an operational amplifier 207. The operational amplifier 207 for example includes an input stage 208 and an output stage 209. The non-overlapping clocks are utilized to turn on and turn off the switches 201 to 204. In the first period, the switches 201 and 204 are conducted and the switches 202 and 203 are un-conducted, meanwhile an input information is stored in the capacitor 205, and the output voltage $V_{out}$ is obtained from the information stored in the capacitor 206. Further in the second period, the switches 202 and 203 are conducted and the switches 201 and 204 are un-conducted, meanwhile the output voltage $V_{out}$ is obtained from the information stored in the capacitor 205, and next an input information will be stored in the capacitor 206. However, in the ample and hold circuit shown as FIG. 2, there existing a disadvantage of voltage level distortion of $V_{out}$ due to the charge distribution effect.

SUMMARY OF THE INVENTION

Owing to the above mentioned, an object of the present invention is to provide a sample and hold circuit, for preventing an output voltage distortion caused by a charge distribution effect from being occurring.

Another object of the present invention is to provide a sample and hold circuit, except of the above mentioned objects, further to provide a sample and hold circuit having two-channels.

According to the above mentioned objects and other objects, the present invention provides a sample and hold circuit, including a first switch, a first capacitor and an amplifier. A first terminal of the first switch receives an input signal, for transmitting the input signal to its second terminal in a sample period. A first terminal of the first capacitor is coupled to the second terminal of the first switch, and a second terminal of the first capacitor is coupled to a first voltage, for storing the sampling result of the input signal. And the amplifier, couples to the second terminal of the first switch, and is disabled in the sample period, and is enabled to generate an output signal according to the sampling result in a hold period.

In accordance with the sample and hold circuit of the preferred embodiments of the present invention, the above mentioned amplifier includes a positive input terminal, a negative input terminal, an output terminal, an input stage, and an output stage. The positive input terminal couples to the second terminal of the first switch. The output terminal couples to the negative input terminal, for outputting the output signal. The input stage couples to the positive input terminal and the negative input terminal, for outputting an internal signal in the hold period according to the signals of the positive input terminal and the negative input terminal, and stopping to output the internal signal in the sample period. The output stage provides the output signal to the output terminal according to the internal signal.

In accordance with the sample and hold circuit of the preferred embodiments of the present invention, the above mentioned input stage includes a first controllable current source, a first transistor and a second transistor. Wherein, the first controllable current source provides current during the hold period but does not provide current during the sample period. A gate terminal of the first transistor couples to the positive input terminal, a first source/drain of the first transistor couples to the first controllable current source, and a second source/drain of the first transistor couples to the output stage. A gate terminal of the second transistor couples to the negative input terminal, a first source/drain of the second transistor couples to the first controllable current source, and a second source/drain of the second transistor couples to the output stage. In accordance with the sample and hold circuit of the preferred embodiments of the present invention, the above mentioned first voltage is a ground voltage.

In accordance with the sample and hold circuit of the preferred embodiments of the present invention, the above mentioned input stage further includes a second controllable current source, a third transistor and a fourth transistor. The second controllable current source provides current during the hold period but does not provide current during the sample period. A gate terminal of the third transistor couples to the positive input terminal, a first source/drain of the third transistor couples to the second controllable current source, and a second source/drain of the third transistor couples to the output stage. A gate terminal of the fourth transistor couples to the negative input terminal, a first source/drain of the fourth transistor couples to the second controllable current source, and a second source/drain of the fourth transistor couples to the output stage.

In another aspect, the present invention provides a sample and hold circuit, including a first switch, a fourth switch, a first capacitor, a second capacitor and an amplifier. A first terminal of the first switch receives an input signal, for transmitting the input signal to its second terminal in a first period. A first terminal of the fourth switch receives the input signal, for transmitting the input signal to its second terminal in a second period. A first terminal of the first capacitor is coupled to the second terminal of the first switch, and a second terminal of the first capacitor is coupled to a first voltage, for storing a first sampling result of the input signal. A first terminal of the second capacitor couples to the second end of the fourth switch, a second terminal of the second capacitor couples to a fourth voltage, for storing a second sampling result of the input signal. The amplifier couples to the second terminal of the first switch and the second terminal of the fourth switch, for outputting an output signal in the first period according to the second sampling result, and outputting the output signal in the second period according to the first sampling result.

In the present invention, because the input stage of the amplifier couples to the sampling capacitor without through the switch, further the switch is disposed in the amplifier; the invention can eliminate the output distortion caused by the charge distribution effect.

The above is a brief description of some deficiencies in the prior art and advantages of the present invention. Other features, advantages and embodiments of the invention will be apparent to those skilled in the art from the following description, accompanying drawings and appended claims.

DESCRIPTION OF THE PREFERRED EMBODIMENTS

Figure 3:
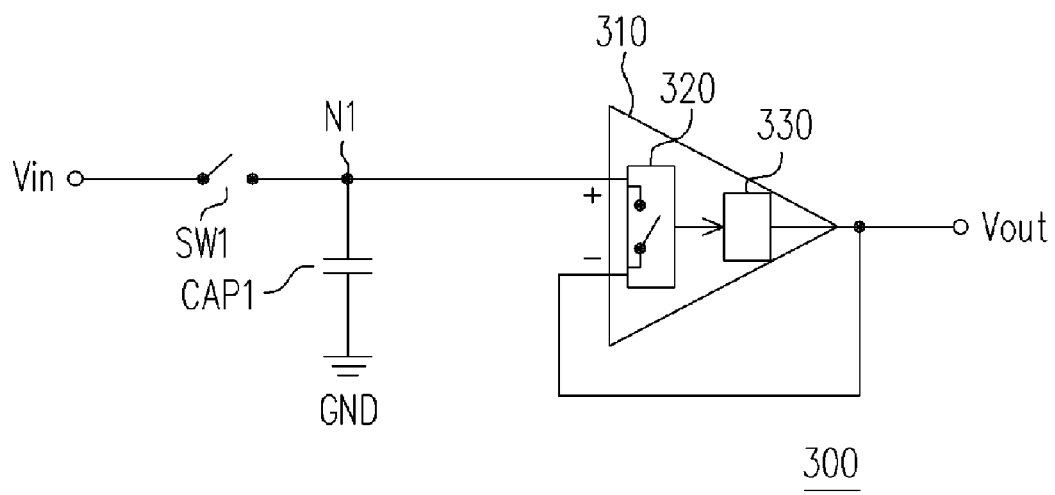
FIG. 3 is a drawing, schematically showing a view of a sample and hold circuit of which can prevent from output distortion caused by charge distribution effect according to an embodiment of the present invention.

FIG. 3 is a drawing, schematically showing a view of a sample and hold circuit of which can prevent output distortion caused by charge distribution effect according to an embodiment of the present invention. As shown in FIG. 3, the sample and hold circuit 300 includes a first switch SW1, a first capacitor CAP1 and an amplifier 310. A first terminal of the switch SW1 receives an input signal $V_{in}$ being sampled. The switch SW1 transmits the input signal $V_{in}$ from its first terminal to its second terminal in a sample period, and un- conducts the path between the first terminal and the second terminal in a hold period. A first terminal of the capacitor CAP1 couples to the second terminal of the switch SW1, a second terminal of the capacitor CAP1 couples to a first voltage (it is ground voltage GND in the embodiment), for storing the sampling result of the input signal $V_{in}$. A positive input terminal of the amplifier 310 couples to the second terminal of the switch SW1, and an output terminal of the amplifier 310 couples to a negative input terminal. Wherein, the amplifier 310, is disabled in the sample period, and is enabled to generate an output signal $V_{out}$ according to the sampling result in the hold period.

In the embodiments of the present invention, although the output of the amplifier 310 is directly fed backed to a negative input terminal as an unity-gain buffer, the invention can also be similarly extended to other configuration of amplifier, as can be understood by those skilled in the art. For example, a resistor is disposed at the feedback path from the output terminal to the negative input terminal, or further the negative input terminal is connected to the ground through the resistor. The internal part of the above mentioned amplifier 310 for example includes an output stage 330 and an input stage 320. The input stage 320 outputs an internal signal according to signals of the positive input terminal and the negative input terminal of the amplifier 310. The output stage provides the output signal $V_{out}$ to the output terminal of the amplifier 310 according to the internal signal.

Figure 1:
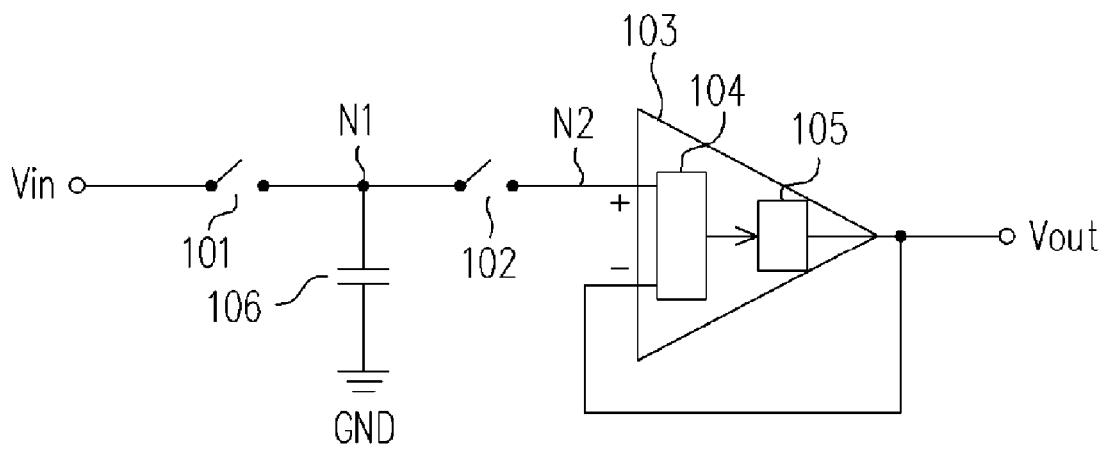
FIG. 1 is a drawing, schematically showing a view of a conventional sample and hold circuit.
Figure 2:
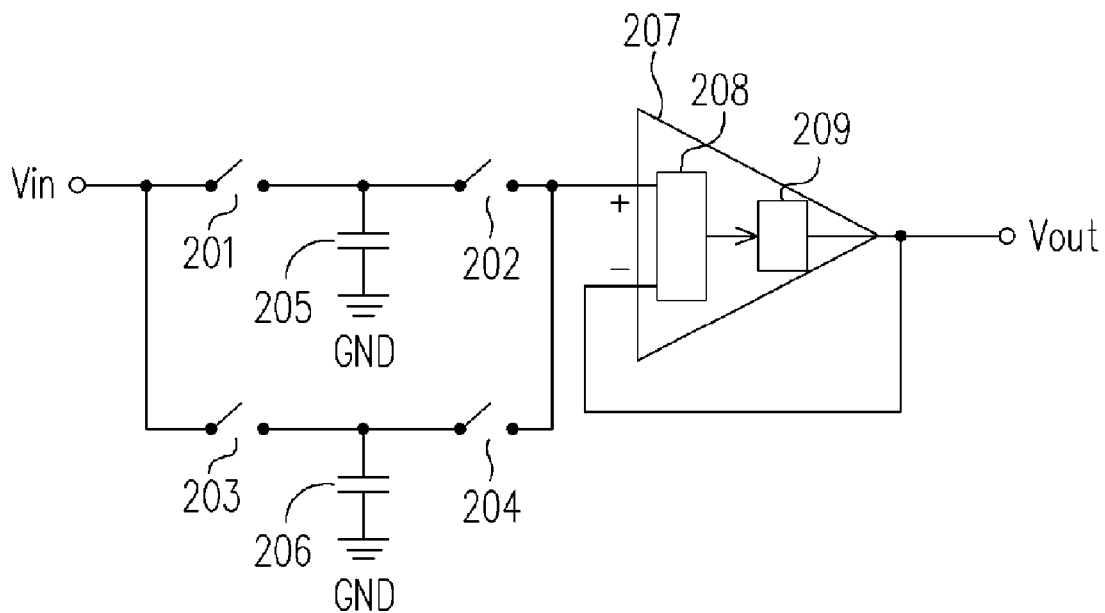
FIG. 2 is a drawing, schematically showing a view of another conventional sample and hold circuit.

In the sample period, the switch SW1 is conducted and the input stage 320 stops outputting the internal signal, meanwhile the output signal $V_{in}$ is at same time stored in the capacitor CAP1 and a parasitic capacitor CP1 between a gate of the positive input terminal of the input stage 320 and ground. Thus, a voltage of a node N1 is $V_{in}$. Further in the hold period, the switch SW1 is switched off and the input stage 320 starts outputting the internal signal to the output stage 330 according to the signals of the positive input terminal and the negative input terminal. Thus, the output stage 330 outputs the signal $V_{out}$. Comparing with the conventional sample and hold circuit shown as FIG. 1, the voltage level of the sample capacitor CAP1 and the parasitic capacitor CP1 are completely equal in the embodiment of the present invention. Accordingly, there is no charge distribution occurs and the output voltage is kept unchanged.

Figure 3A:
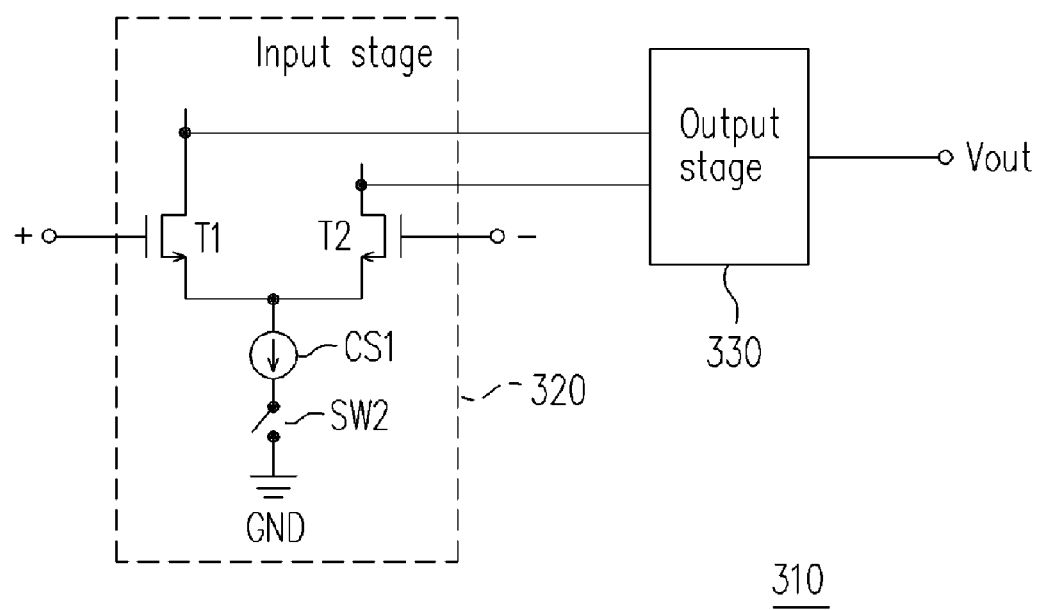
FIG. 3A to 3C are drawings, schematically showing views of an amplifier circuit according to an embodiment of the present invention.

The above mentioned input stage 320 can be implemented according to FIG. 3A. FIG. 3A is a drawing, schematically showing a view of an amplifier circuit according to an embodiment of the present invention. In order to describe conveniently, part elements of the amplifier 310 and the input stage 320 are not shown in FIG. 3A. The input stage 320 includes a controllable current source, a first transistor T1 and a second transistor T2. The controllable current source includes, for example, a second switch SW2 and a first current source CS1. Wherein, the transistor T1 and the transistor T2, for example, are implemented with NMOS transistors. A first terminal of the switch SW2 couples to a second voltage (herein for example is the ground voltage GND), for transmitting the ground voltage GND to its second terminal in the hold period, and switching off in the sample period. A first terminal of the current source CS1 couples to the second terminal of the switch SW2. A gate terminal of the transistor T1 couples to the positive input terminal of the amplifier 310. A source of the transistor T1 couples to a second terminal of the current source CS1. A drain of the transistor T1 couples to the output stage 330. A gate terminal of the transistor T2 couples to the negative input terminal of the amplifier 310. A source of the transistor T2 couples to the second terminal of the current source CS1, and a drain of the transistor T2 couples to the output stage 330.

Figure 3B:
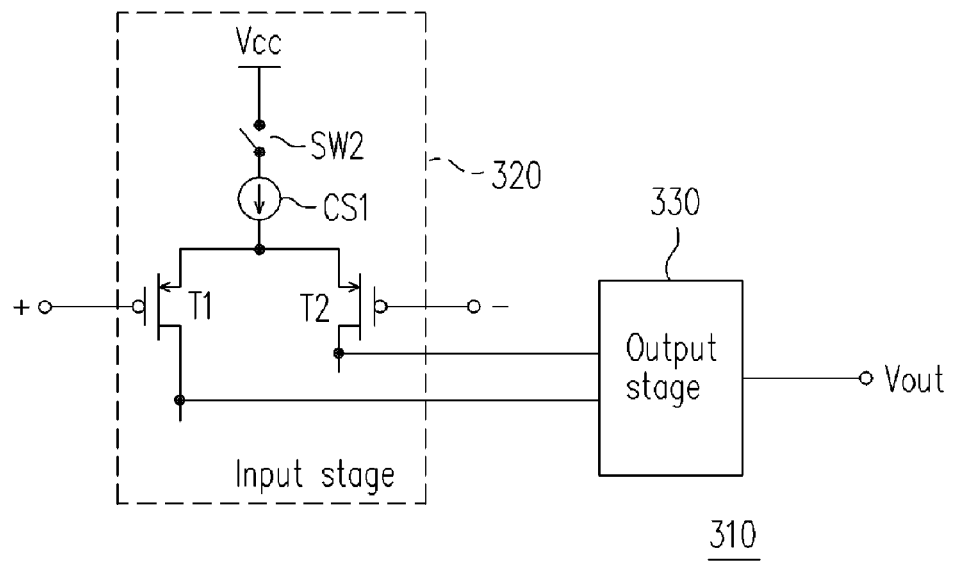

Another embodiment of the input stage 320 is described as follows. FIG. 3B is a drawing, schematically showing a view of an amplifier circuit according to an embodiment of the present invention. In order to describe conveniently, part components of the amplifier 310 and the input stage 320 are not shown in FIG. 3B. The input stage 320 includes a controllable current source, a first transistor T1 and a second transistor T2. The controllable current source includes, for example, a second switch SW2, a first current source CS1. Wherein, the transistor T1 and the transistor T2 for example are implemented with PMOS transistors. A first terminal of the switch SW2 couples to a second voltage (herein for example is the power voltage VCC), for transmitting the power voltage VCC to its second terminal in the hold period, and switching off in the sample period. A first terminal of the current source CS1 couples to the second terminal of the switch SW2. A gate terminal of the transistor T1 couples to the positive input terminal of the amplifier 310. A gate terminal of the transistor T2 couples to the negative input terminal of the amplifier 310. The sources of the transistor T1 and the transistor T2 couple to a second terminal of the current source CS1. The drains of the transistor T1 and the transistor T2 couple to the output stage 330.

Figure 3C:
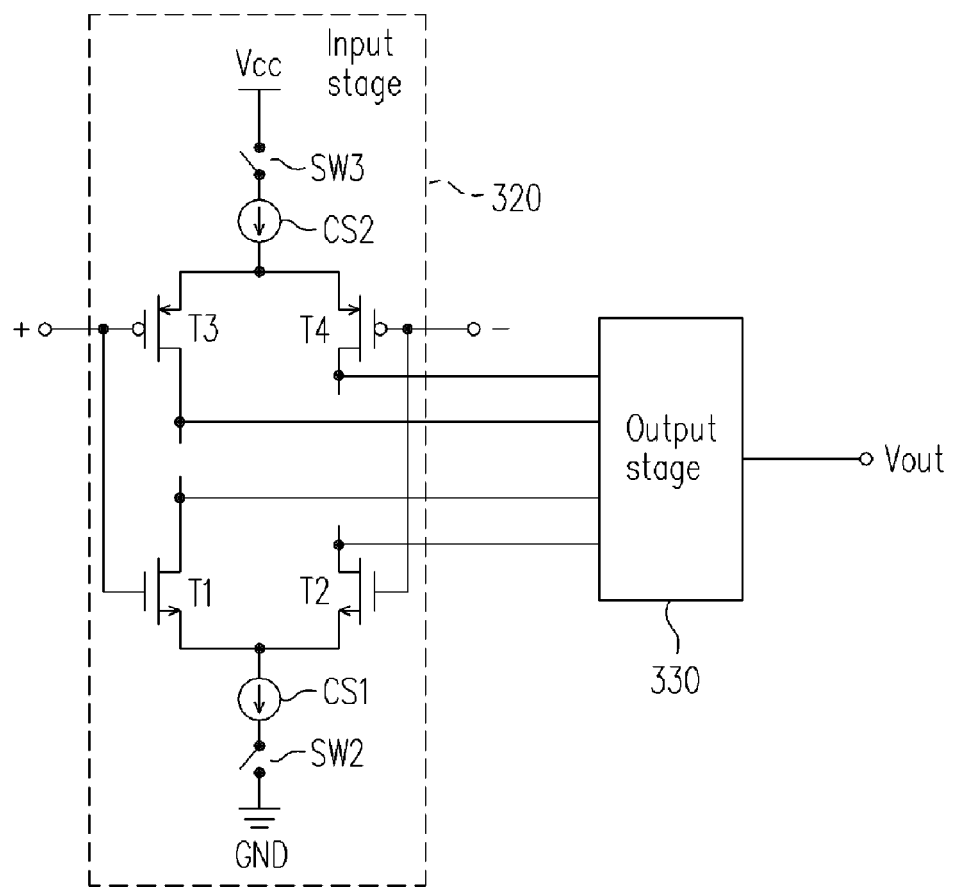

With respect to the rail-to-rail requirements, another embodiment of the input stage 320 is described as follows. FIG. 3C is a drawing, schematically showing a view of a rail-to-rail amplifier circuit according to an embodiment of the present invention. In order to describe conveniently, part components of the amplifier 310 and the input stage 320 are not shown in FIG. 3C. The input stage 320 includes a first controllable current source, a second controllable current source, a first transistor T1, a second transistor T2, a third transistor T3 and a fourth transistor T4. The first controllable current source includes, for example, a second switch SW2 and a first current source CS1. The second controllable current source includes, for example, a third switch SW3 and a second current source CS2. Wherein the transistor T1 and the transistor T2 for example are implemented with NMOS transistors, whereas the transistor T3 and the transistor T4 for example are implemented with PMOS transistors. A first terminal of the switch SW2 couples to a second voltage (herein for example is the ground voltage GND), for transmitting the ground voltage GND to its second terminal in the hold period, and switching off in the sample period. A first terminal of the current source CS1 couples to the second terminal of the switch SW2. A second terminal of the current source CS1 couples to sources of the transistor T1 and the transistor T2. Gate terminals of the transistors T1 and T3 couple to the positive input terminal of the amplifier 310. Gate terminals of the transistors T2 and T4 couple to the negative input terminal of the amplifier 310. All drains of the transistors T1, T2, T3 and T4 couple to the output stage 330. A first terminal of the switch SW3 couples to a third voltage (herein for example is the power voltage VCC), for transmitting the power voltage VCC to its second terminal in the hold period, and switching off in the sample period. A first terminal of the power source CS2 couples to a second terminal of the switch SW3, a second terminal of the power source CS2 couples to sources of the transistors T3 and T4.

Figure 4:
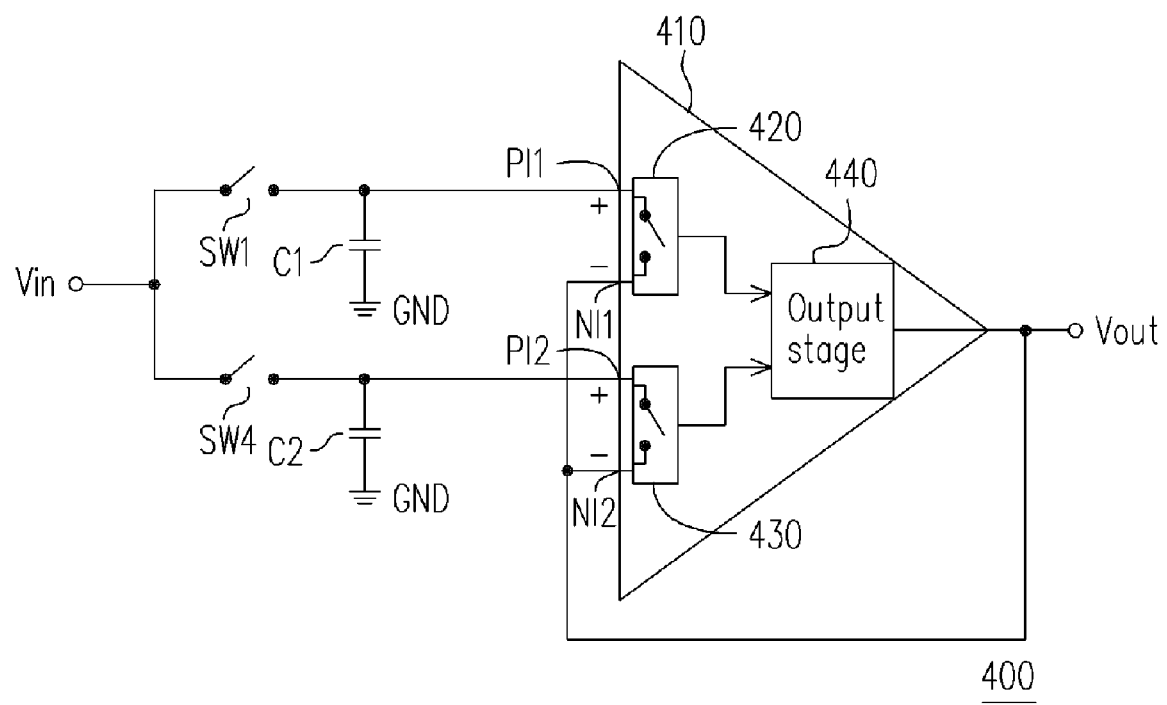
FIG. 4 is a drawing, schematically showing a view of a two-channel sample and hold circuit according to an embodiment of the present invention.

Another embodiment of the present invention is provided as follows, to meet the requirement of a two-channel sampling. As shown in FIG. 4, the sample and hold circuit 400 includes a first switch SW1, a fourth switch SW4, a first capacitor C1, a second capacitor C2 and an amplifier 410. The internal part of the amplifier 410 for example includes an output stage 440 and a first input stage 420 and a second input stage 430. The input stage 420 and 430 separately outputs internal signals according to signals of a first positive input terminal PI1 and a first negative input terminal NI1 of the amplifier 410, and signals of a second positive input terminal PI2 and a second negative input terminal NI2 of the amplifier 410, respectively. The output stage provides the output signal Vout to the output terminal of the amplifier 410 according to the internal signals.

First terminals of the switch SW1 and SW4 all receive an input signal $V_{in}$. A first terminal of the capacitor C1 couples to the second terminal of the switch SW1, a second terminal of the capacitor C1 couples to a first voltage (herein for example is the ground voltage GND), for storing a first sampling result of the input signal $V_{in}$. A first terminal of the capacitor C2 couples to the second terminal of the switch SW4, a second terminal of the capacitor C2 couples to a fourth voltage (herein for example is the ground voltage GND), for storing a second sampling result of the input signal $V_{in}$. The amplifier 410 couples to second terminals of the switch SW1 and the switch SW4. In a first period, the switch SW1 transmits the input signal $V_{in}$ to its second terminal, for charging to the capacitor C1 and a parasitic capacitor CP1 between a gate of the positive input terminal PI1 of the input stage 420 and the ground. Meanwhile, the switch SW4 is un-conducted, whereas the amplifier 410 outputs the output signal $V_{out}$ according to the second sampling result of the capacitor C2 and a parasitic capacitor CP2 between a gate of the positive input terminal PI2 and the ground. Further, in a second period, the switch SW4 transmits the input signal $V_{in}$ to its second terminal, for charging to the capacitor C2 and a parasitic capacitor CP2. Meanwhile, the switch SW1 is un-conducted, whereas the amplifier 410 outputs the output signal $V_{out}$ according to the first sampling result of the capacitor C1 and a parasitic capacitor CP1.

In the embodiment of the present invention, although the output of the amplifier 410 is directly fed backed to a negative input terminal as an unity-gain buffer, various modifications, alternate construction, and equivalent to other configuration of amplifier may be made by those skilled in the art according to the scope or spirit of the invention. For example, a resistor is disposed at the feedback path from the output terminal to the negative input terminal, or further the negative input terminal is connected to the ground through the resistor.

Figure 4A:
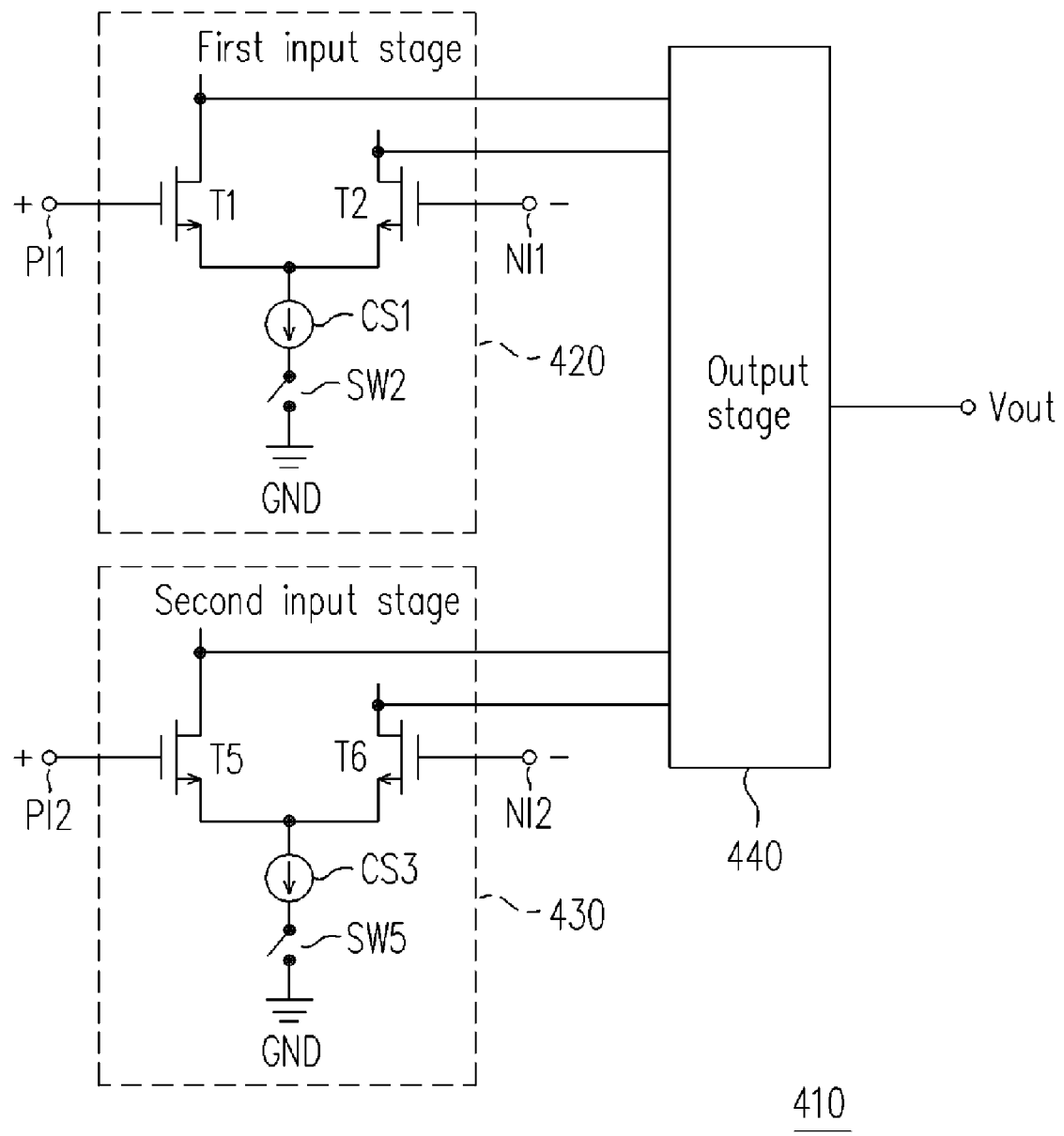
FIGS. 4A to 4C are drawings, schematically showing views of a two-channel amplifier circuit according to an embodiment of the present invention.

FIG. 4A is a drawing, schematically showing a view of amplifier circuit 410 according to an embodiment of the present invention. In order to describe conveniently, part components of the amplifier 410 and a first input stage 420 and a second input stage 430 are not shown in FIG. 4A. The above mentioned input stage 420 for example includes a first controllable current source, a first transistor T1 and a second transistor T2. The first controllable current source includes, for example, a second switch SW2 and a first current source CS1. Wherein, the transistor T1 and the transistor T2 for example are NMOS transistors. A first terminal of the switch SW2 couples to a second voltage (herein for example is the ground voltage GND), for transmitting the ground voltage GND to its second terminal in the second period, and switching off in the first period. Therefore, the first input stage 420 outputs the internal signal to the output 440 in the second period, and stops outputting the internal signal in the first period. A first terminal of the current source CS1 couples to the second terminal of the switch SW2. A gate terminal of the transistor T1 couples to the first positive input terminal PI1 of the amplifier 410. A gate of the transistor T2 couples to the first negative input terminal NI1 of the amplifier 410. Sources of the transistors T1 and T2 couple to the second terminal of the current source CS1, and drains of the transistors T1 and T2 couple to the output stage 440.

The above mentioned second input stage 430 for example includes a second controllable current source, a fifth transistor T5 and a sixth transistor T6. The second controllable current source includes, for example, a fifth switch SW5 and a third current source CS3. Wherein the transistor T5 and the transistor T6 for example are NMOS transistors. A first terminal of the switch SW5 couples to a fifth voltage (herein for example is the ground voltage GND), for transmitting the ground voltage GND to its second terminal in the first period, and switching off in the second period. Therefore the second input stage 430 outputs the internal signal to the output 440 in the first period, and stops outputting the internal signal in the second period. A first terminal of the current source CS3 couples to the second terminal of the switch SW5. A gate terminal of the transistor T5 couples to the second positive input terminal PI2 of the amplifier 410. A gate terminal of the transistor T6 couples to the second negative input terminal NI2 of the amplifier 410. Sources of the transistors T5 and T6 couple to a second terminal of the current source CS3, and drains of the transistors T5 and T6 couple to the output stage 440.

Figure 4B:
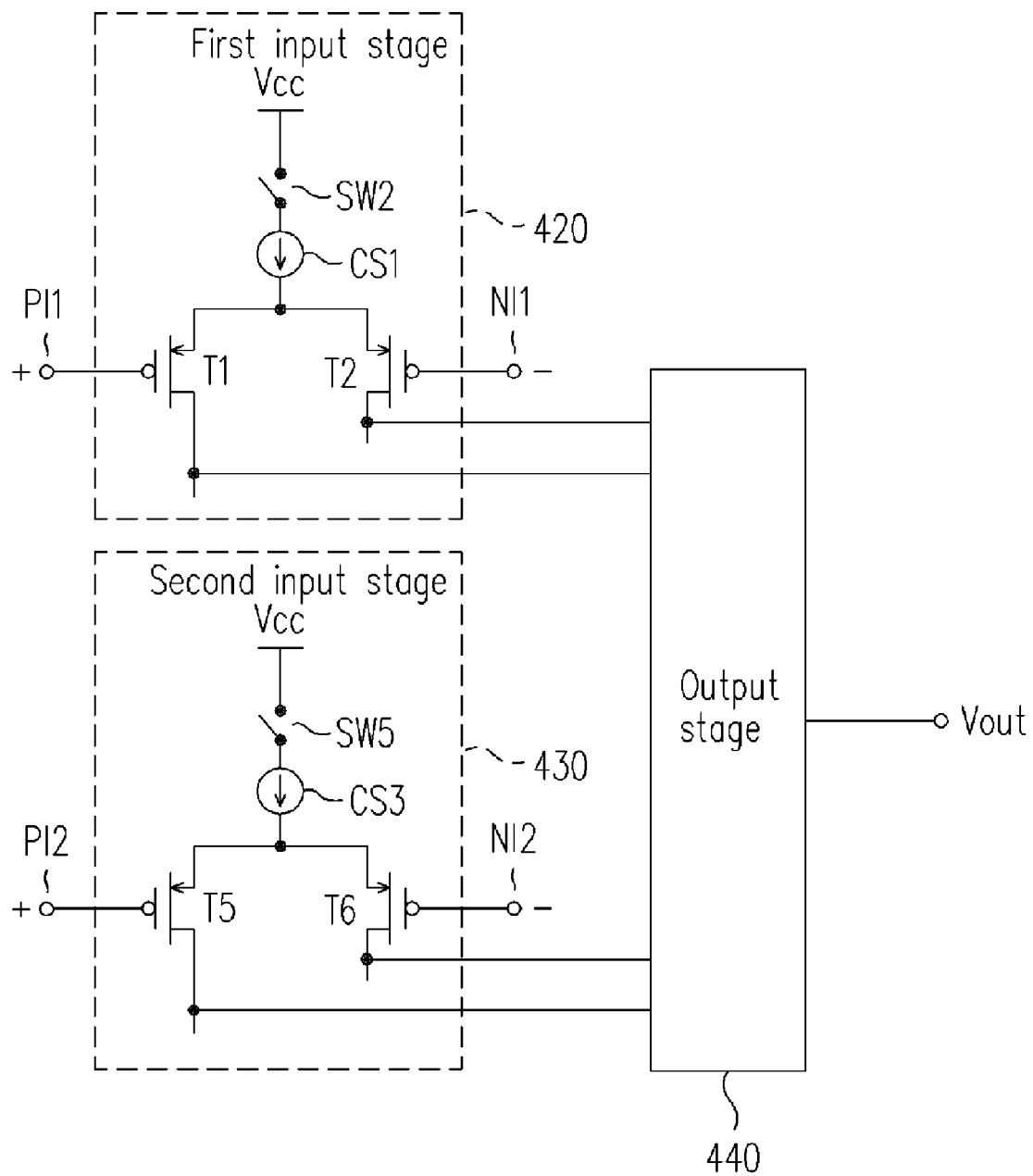

FIG. 4B is a drawing, schematically showing a view of amplifier circuit according to another embodiment of the present invention. In order to describe conveniently, part components of the amplifier 410 and a first input stage 420 and a second input stage 430 are not shown in FIG. 4B. The above-mentioned input stage 420 for example includes a first controllable current source, a first transistor T1 and a second transistor T2. The first controllable current source includes, for example, a second switch SW2 and a first current source CS1. A first terminal of the switch SW2 couples to a second voltage (herein for example is the power voltage VCC), for transmitting the power voltage VCC to its second terminal in the second period, and switching off in the first period. Therefore, the first input stage 420 outputs the internal signal to the output 440 in the second period, and stops outputting the internal signal in the first period. A first terminal of the current source CS1 couples to the second terminal of the switch SW2. A gate terminal of the transistor T1 couples to the first positive input terminal PI1 of the amplifier 410. A gate of the transistor T2 couples to the first negative input terminal NI1 of the amplifier 410. Sources of the transistors T1 and T2 couple to the second terminal of the current source CS1, and drains of the transistors T1 and T2 couple to the output stage 440. Wherein, the transistor T1 and the transistor T2 for example are PMOS transistors.

The above mentioned second input stage 430 for example includes a second controllable current source, a fifth transistor T5 and a sixth transistor T6. The second controllable current source includes, for example, a fifth switch SW5 and a third current source CS3. A first terminal of the switch SW5 couples to a fifth voltage (herein for example is the power voltage VCC), for transmitting the power voltage VCC to its second terminal in the first period, and switching off in the second period. Therefore, the second input stage 430 outputs the internal signal to the output 440 in the first period, and stops outputting the internal signal in the second period. A first terminal of the current source CS3 couples to the second terminal of the switch SW5. A gate terminal of the transistor T5 couples to the second positive input terminal PI2 of the amplifier 410. A gate terminal of the transistor T6 couples to the second negative input terminal NI2 of the amplifier 410. Sources of the transistors T5 and T6 couple to a second terminal of the current source CS3, and drains of the transistors T5 and T6 couple to the output stage 440. Wherein, the transistor T5 and the transistor T6 for example are PMOS transistors.

Figure 4C:
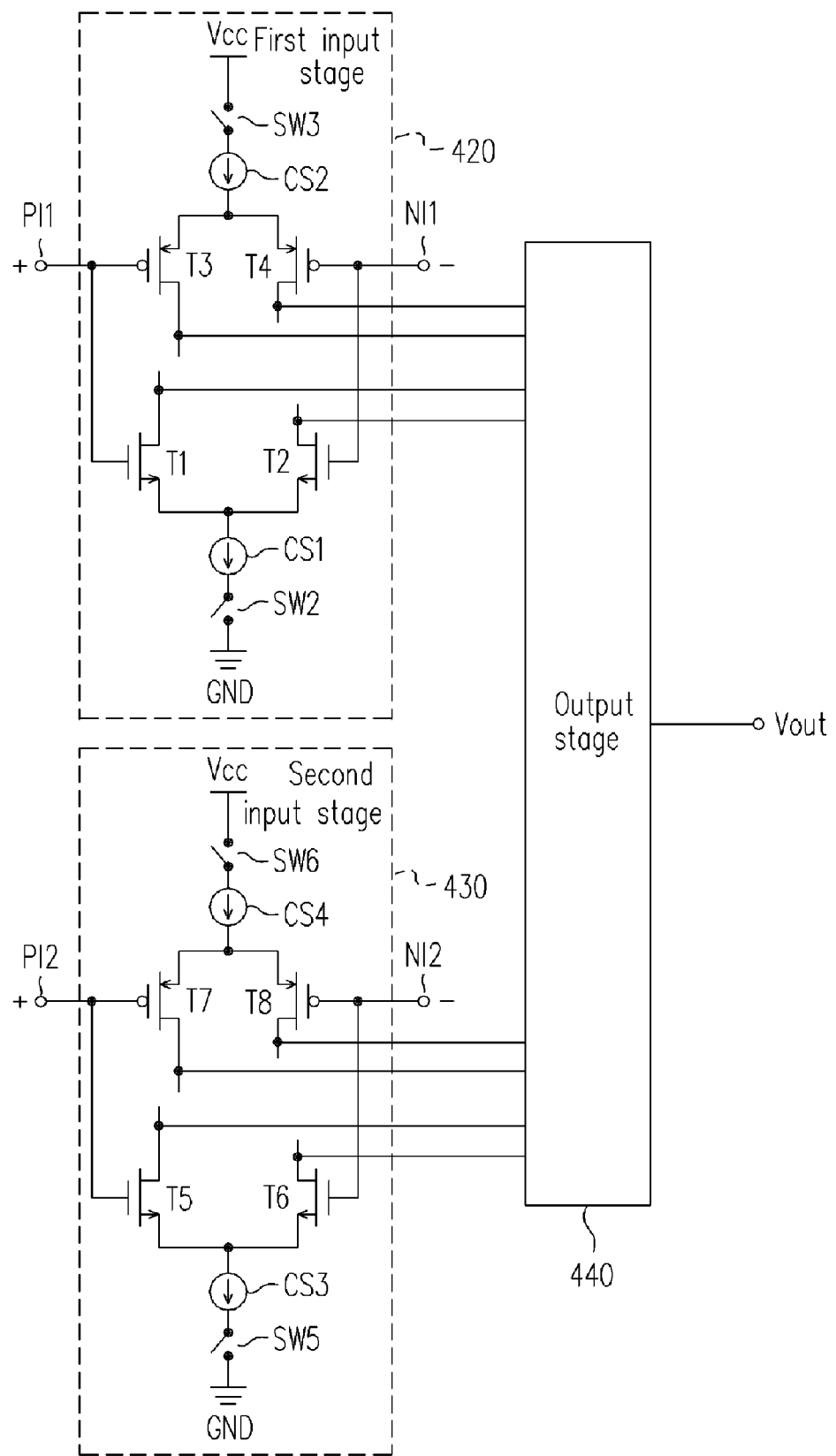

Of course, the amplifier 410 also can be designed as a rail-to-rail amplifier as shown in FIG. 4C. In order to describe conveniently, part components of the amplifier 410 and a first input stage 420 and a second input stage 430 are not shown in FIG. 4C. The above mentioned first input stage 420 for example includes a first controllable current source, a third controllable current source, a first transistor T1, a second transistor T2, a third transistor T3 and a fourth transistor T4. The first controllable current source includes, for example, a second switch SW2 and a first current source CS1. The third controllable current source includes, for example, a third switch SW3 and a second current source CS2. The second input stage 430 for example includes a second controllable current source, a fourth controllable current source, a fifth transistor T5, a sixth transistor T6, a seventh transistor T7 and an eighth transistor T8. The second controllable current source includes, for example, a fifth switch SW5 and a third current source CS3. The fourth controllable current source includes, for example, a sixth switch SW6 and a fourth current source CS4. Wherein, the transistors T1, T2, T5, and T6 for example are NMOS transistors, whereas the transistors T3, T4, T7 and T8 for example are PMOS transistors. A first terminal of the switch SW2 couples to a second voltage (herein for example is the ground voltage GND). A first terminal of the switch SW3 couples to a third voltage (herein for example is the power voltage VCC). A first terminal of the switch SW5 couples to a fifth voltage (herein for example is the ground voltage GND). A first terminal of the switch SW6 couples to a sixth voltage (herein for example is the power voltage VCC). In the first period, the switches SW2 and SW3 are un-conducted, whereas the switches SW5 and SW6 respectively conduct the ground voltage GND and the power voltage VCC to the current sources CS3 and CS4. Further in the second period, the switches SW2 and SW3 respectively conduct the ground voltage GND and the power voltage VCC to the current sources CS1 and CS2, whereas the switches SW5 and SW6 are un-conducted. Therefore, in the first period, the second input stage 430 outputs the internal signal to the output stage 440 (meanwhile the first input stage 420 stops outputting the internal signal), further in the second period, the first input stage 420 outputs the internal signal to the output stage 440 (meanwhile the second input stage 430 stops outputting the internal signal).

Figure 5A:
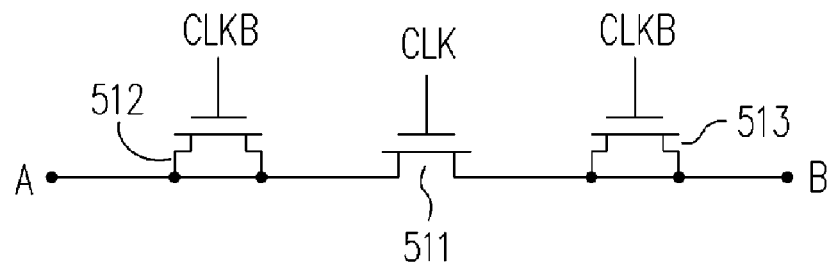
FIGS. 5A to 5C are drawings, schematically showing views of switch according to an embodiment of the present invention.

The above-mentioned switches in the embodiments of the present invention can be implemented according to FIG. 5A. FIG. 5A is a drawing, schematically showing a view of switch according to an embodiment of the present invention. The switch includes a switch transistor 511, a dummy switch transistor 512 and a dummy switch transistor 513, which are series connected. Wherein, the transistors 511, 512 and 513 are NMOS transistors. The transistors 511, 512 and 513 are respectively controlled by a control clock CLK and an invert-phase control clock CLKB. When the control clock CLK is at a high voltage level (it means that the anti-phase control clock CLKB is at a low voltage level), large quantity of electrons is accumulated between a source and a drain of the transistor 511, so as to form an N channel, therefore a transmitting path is formed between a node A and a node B. When the state of the control clock CLK changes from the high voltage level to a low voltage level, the node A and the node B is un-conducted. The large quantity of electrons, accumulated between the source and the drain of the transistor 511, will flow out from the channel region of the transistor 511 to the drain and the source junctions to generate a charge injection error.

Therefore, it is necessary that the dummy switch transistors 512 and 513 are disposed at two sides of the switch transistor 511. By the invert-phase control clock CLKB being changed to the high voltage level, the N channels in the transistors 512 and 513 are respectively formed and the electrons from the transistor 511 are attracted. Of course, in order to reduce a circuit area, one of the dummy switch transistors can be omitted, or all the two dummy switch transistors can be omitted.

Figure 5B:
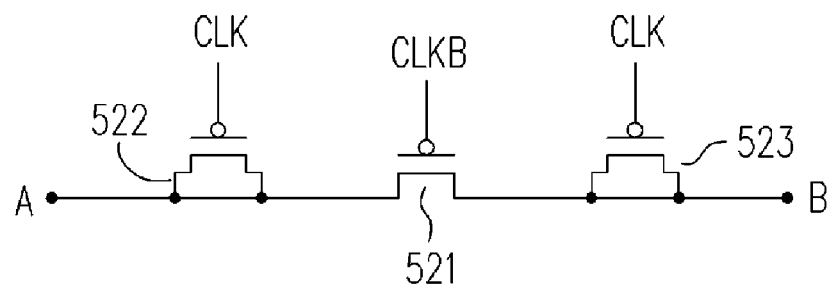

Of course, the implementation of the switch is not limited to the NMOS transistor. FIG. 5B is a switch structured with a PMOS transistor. The switch as shown FIG. 5B includes a switch transistor 521, a dummy switch transistor 522 and a dummy switch transistor 523, which are series connected. The transistors 521, 522 and 523 are respectively controlled by the control clock CLK and the invert-phase control clock CLKB. When the invert-phase control clock CLKB is at the low voltage level (it means that the control clock CLK is at the high voltage level), large quantity of electric holes are accumulated between the source and the drain of the transistor 521, to form a P channel, therefore a transmitting path is formed between a node A and a node B. When the state of the invert-phase control clock CLKB changes from the low voltage level to the high voltage level, the large quantity of electric holes, accumulated between the source and the drain of the transistor 521, will flow out from the channel region of the transistor 521 to the drain and the source junctions to generate a charge injection error. Therefore, it is necessary that the dummy switch transistors 522 and 523 are disposed at two sides of the switch transistor 521. By the control clock CLK being changed to the low voltage level, the P channels in the transistors 522 and 523 are respectively formed and the electric holes from the transistor 521 are attracted. Of course, in FIG. 5B, one of the dummy switch transistors can be omitted, or all the two dummy switch transistors can be omitted.

Figure 5C:
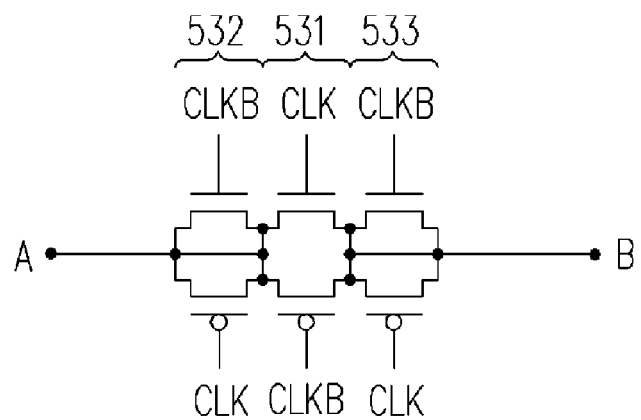

Besides utilizing the transistors as the switch, a transmission gate can also be utilized as the switch. FIG. 5C is a drawing, schematically showing a view of utilizing transmission gate as switch according to an embodiment of the present invention. The switch shown in FIG. 5C includes a transmission gate 531, a dummy transmission gate 532 and a dummy transmission gate 533, which are series connected. The transmission gates 531, 532 and 533 are respectively controlled by a control clock CLK and an invert-phase control clock CLKB. When the control clock CLK is at a high voltage level (it means that the invert-phase control clock CLKB is at a low voltage level), the transmitting gate 531 accumulates large quantity of charges and is thereby connected, so that a transmitting path is formed between a node A and a node B. When the state of the control clock CLK changes from the high voltage level to a low voltage level (it means that the state of the invert-phase control clock CLKB changes from the low voltage level to the high voltage level), the large quantity of charges, previously accumulated at the transmission gate 531, will flow out from the channel region of the transistor 531 to the drain and the source junctions to generate a charge injection error, therefore it is necessary that the dummy transmission gates 532 and 533 are disposed at two sides of the transmission gate 531. By the control clock CLK being changed to the low voltage level, and the invert-phase control clock CLKB being changed to the high voltage level, the dummy transmission gates 532 and 533 therefore respectively attract the charges coming from the transmission gates 531. Of course, in FIG. 5C, one of the dummy transmission gates can be omitted, or all the two dummy transmission gates can be omitted.

Figure 6:
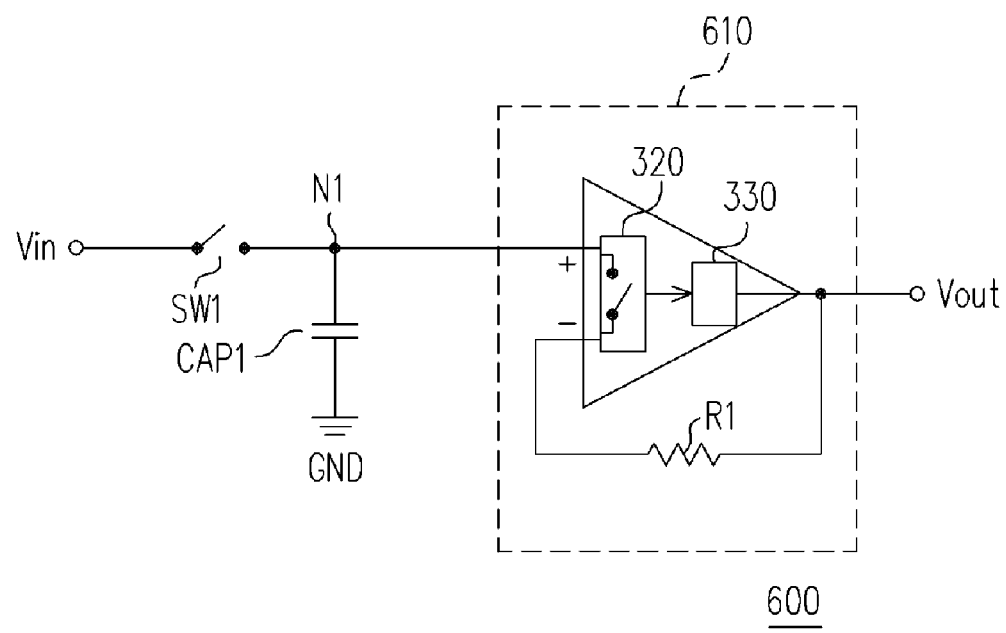
FIG. 6 is a drawing, schematically showing a view of another sample and hold circuit according to another embodiment of the present invention.

FIG. 6 is a drawing, schematically showing a view of another sample and hold circuit according to another embodiment of the present invention. The sample and hold circuit 600 is similar to the sample and hold circuit 300 as shown FIG. 3, the difference is that the output of the amplifier 610 in the sample and hold circuit 600 is fed backed to the negative input terminal through a resistor R1.

Figure 7:
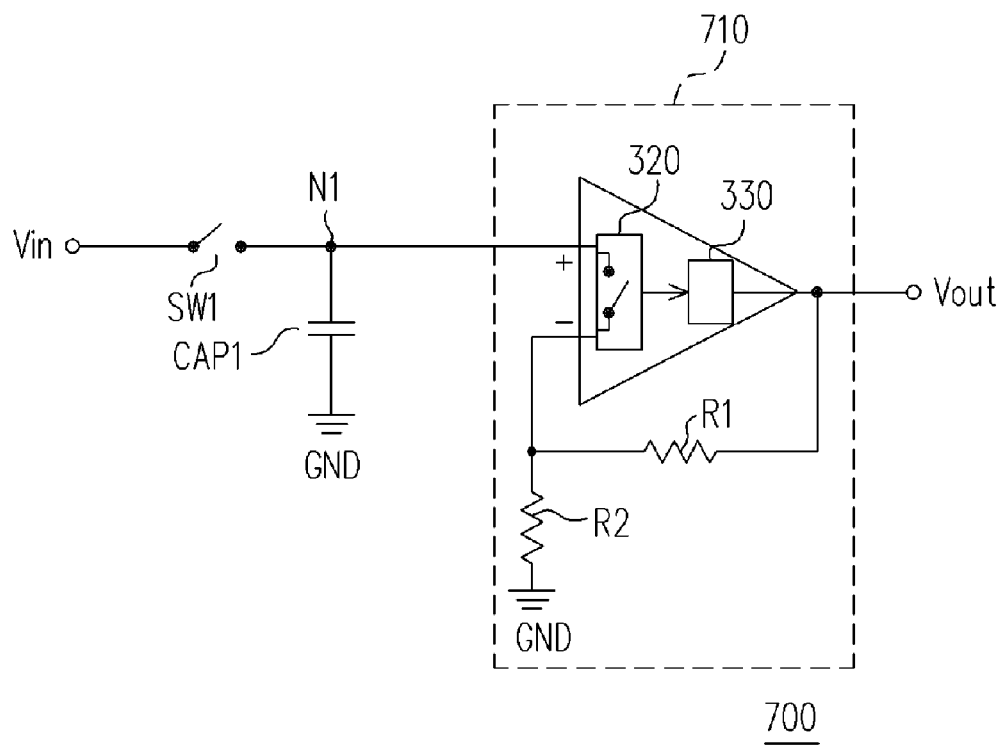
FIG. 7 is a drawing, schematically showing a view of another sample and hold circuit according to another embodiment of the present invention.

FIG. 7 is a drawing, schematically showing a view of another sample and hold circuit according to another embodiment of the present invention. The sample and hold circuit 700 is similar to the sample and hold circuit 600 as shown FIG. 6, the difference is that the amplifier 710 in the sample and hold circuit 700 further couples the negative input terminal to the reference voltage (herein for example is the ground voltage GND) through a resistor R2.

Figure 8:
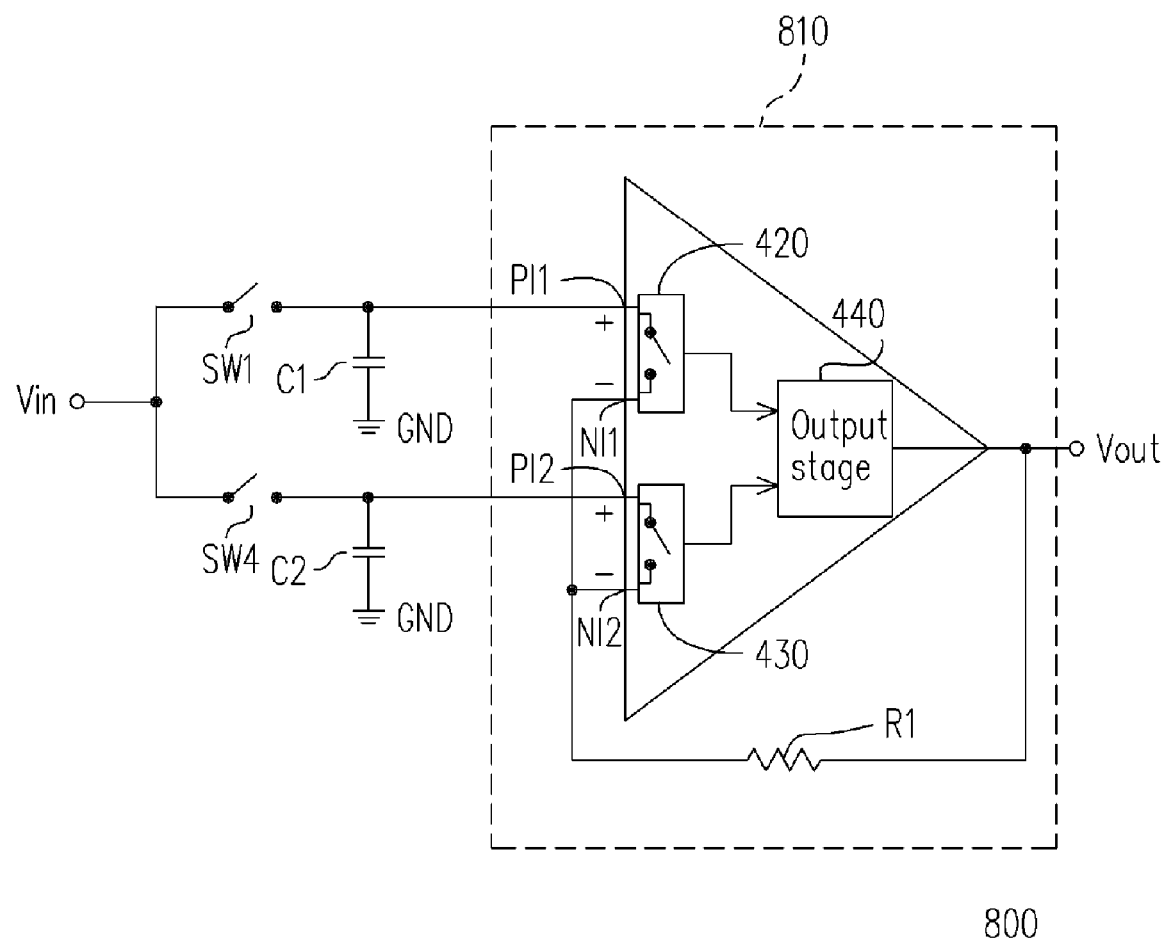
FIG. 8 is a drawing, schematically showing a view of another sample and hold circuit according to another embodiment of the present invention.

FIG. 8 is a drawing, schematically showing a view of another sample and hold circuit according to another embodiment of the present invention. The sample and hold circuit 800 is similar to the sample and hold circuit 400 as shown FIG. 4, the difference is that the output of the amplifier 810 in the sample and hold circuit 800 is fed backed to the first negative input terminal NI1 and to the second negative input terminal NI2 through the resistor R1.

Figure 9:
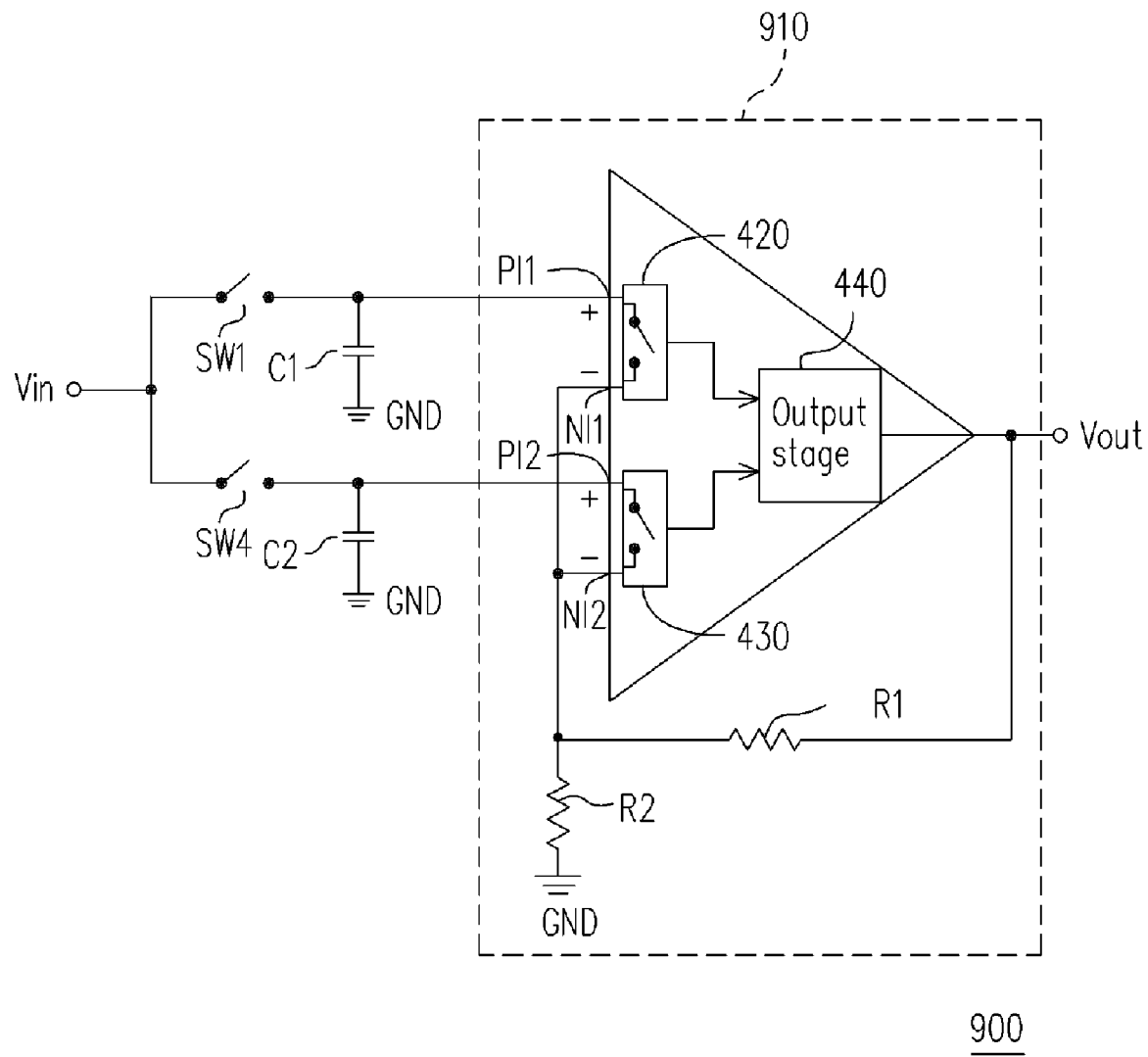
FIG. 9 is a drawing, schematically showing a view of another sample and hold circuit according to another embodiment of the present invention.

FIG. 9 is a drawing, schematically showing a view of another sample and hold circuit according to another embodiment of the present invention. The sample and hold circuit 900 is similar to the sample and hold circuit 800 as shown FIG. 8, the difference is that the amplifier 910 in the sample and hold circuit 900 further couples the reference voltage (herein for example is the ground voltage GND) to the first negative input terminal NI1 and to the second negative input terminal NI2 through the resistor R2.

In summary, the amplifier is coupled to the sampling capacitor without through the switch, further the switch is disposed in the amplifier, so that the voltage level of the sampling capacitor equals to that of the parasitic capacitor of the input terminal of the amplifier. Therefore, the present invention eliminates the output distortion caused by the charge distribution effect.

The above provides a full and complete description of the preferred embodiments of the present invention. Those skilled in the art may make various modifications, alternate constructions, and equivalents without changing the scope or spirit of the invention. Accordingly, the above descriptions and illustrations should not be construed as limiting the scope of the invention that is defined by the following claims.

What is claimed is:

1. A sample-and-hold circuit, comprising:
   a first switch, having a first terminal receiving an input signal, for transmitting the input signal to a second terminal of the first switch in a sample period;
   a first capacitor, wherein a first terminal of the first capacitor couples to the second terminal of the first switch, a second terminal of the first capacitor couples to a first voltage, for storing a sampling result of the input signal; and
   an amplifier, coupling to the second terminal of the first switch, wherein the amplifier is disabled in the sample period, and the amplifier is enabled to output an output signal according to the sampling result in a hold period, the amplifier comprising:
   a positive input terminal coupling to the second terminal of the first switch;
   a negative input terminal;
   an output terminal for outputting the output signal;

a first resistor, wherein a first terminal of the first resistor couples to the negative input terminal, and a second terminal of the first resistor couples to the output terminal; and an input stage coupling to the positive input terminal and the negative input terminal for outputting an internal signal in the hold period according to the signals of the positive input terminal and the negative input terminal and stopping to output the internal signal in the sample period, wherein the input stage comprises:

a first controllable current source, for providing a current during a hold period and not providing the current during the sample period;

a first transistor, having a gate terminal coupled to the positive input terminal, a first source/drain coupled to the first controllable current source, and a second source/drain coupled to an output stage; and a second transistor, having a gate terminal coupled to the negative input terminal, a first source/drain coupled to the first controllable current source, and a second source/drain coupled to the output stage; and the output stage, for providing the output signal to the output terminal according to the internal signal.

2. The sample-and-hold circuit as claimed in claim 1, wherein the amplifier further comprises:

a second resistor, a first terminal of the second resistor coupling to the negative input terminal, a second terminal of the second resistor coupling to a reference voltage.

3. The sample-and-hold circuit as claimed in claim 1, wherein the first controllable current source comprises:

a second switch, wherein a first terminal of the switch couples to a second voltage, for transmitting the second voltage to a second terminal of the second switch in the hold period, and switching off in the sample period; and a first current source, having a first terminal coupled to the second terminal of the second switch, and a second terminal of the first current source coupled to the first source/drain of the first transistor and the second transistor.

4. The sample-and-hold circuit as claimed in claim 2, wherein the reference voltage can be a ground voltage or a power voltage.

5. The sample-and-hold circuit as claimed in claim 3, wherein the first voltage and the second voltage are a ground voltage.

6. The sample-and-hold circuit as claimed in claim 3, wherein the first voltage is a ground voltage, and the second voltage is a power voltage.

7. The sample-and-hold circuit as claimed in claim 1, wherein the input stage further comprises:

a second controllable current source, for providing a current during a hold period and not providing the current during a sample period;

a third transistor, having a gate terminal coupled to the positive input terminal, a first source/drain coupled to the second controllable current source, and a second source/drain coupled to the output stage; and a fourth transistor, having a gate terminal coupled to the negative input terminal, a first source/drain coupled to the second controllable current source, and a second source/drain coupled to the output stage.

8. The sample-and-hold circuit as claimed in claim 7, wherein the second controllable current source comprises:

a third switch, having a first terminal coupled to a third voltage, for transmitting the third voltage to a second terminal of the third switch in the hold period, and switching off in the sample period; and a second current source, having a first terminal coupled to the second terminal of the third switch, and a second terminal of the second current source coupled to the first source/drain of the third transistor and the fourth transistor.

9. The sample-and-hold circuit as claimed in claim 8, wherein the first voltage and the second voltage are a ground voltage, and the third voltage is a power voltage.

10. The sample-and-hold circuit as claimed in claim 8, wherein the first voltage and the third voltage are a ground voltage, and the second voltage is a power voltage.

11. A sample-and-hold circuit, comprising:

a first switch, having a first terminal receiving an input signal, for transmitting the input signal to a second terminal of the first switch in a first period;

a fourth switch, having a first terminal receiving the input signal, for transmitting the input signal to a second terminal of the fourth switch in a second period;

a first capacitor, having a first terminal coupled to the second terminal of the first switch, a second terminal of the first capacitor coupled to a first voltage, for storing a first sampling result of the input signal;

a second capacitor, having a first terminal couples to the second terminal of the fourth switch, a second terminal of the second capacitor coupled to a fourth voltage, for storing a second sampling result of the input signal; and an amplifier, wherein the amplifier comprises:

a first positive input terminal, coupling to the second terminal of the first switch;

a second positive input terminal, coupling to the second terminal of the fourth switch;

a first negative input terminal;

a second negative input terminal;

an output terminal, coupling to the first negative input terminal and the second negative input terminal, for outputting an output signal in the first period according to the second sampling result, and outputting the output signal in the second period according to the first sampling result;

a first input stage, coupling to the first positive input terminal and the first negative input terminal, for outputting a first internal, signal in the second period according to the signals of the first positive input terminal and the first negative input terminal, and stopping to output the first internal signal in the first period;

a second input stage, coupling to the second positive input terminal and the second negative input terminal, for outputting a second internal signal in the first period according to the signals of the second positive input terminal and the second negative input terminal, and stopping to output the second internal signal in the second period; and an output stage, for providing the output signal to the output terminal according to the first internal signal and the second internal signal.

12. The sample-and-hold circuit as claimed in claim 11, wherein the amplifier further comprises:

a second resistor, a first terminal of the second resistor coupling to the first negative input terminal and the second negative input terminal, a second terminal of the second resistor coupling to a reference voltage.

13. The sample-and-hold circuit as claimed in claim 11, wherein the first input stage comprises:

a first controllable current source, for providing a current during the second period, and not providing the current during the first period;

a first transistor, having a gate terminal coupled to the first positive input terminal, a first source/drain coupled to the first controllable current source, and a second source/drain coupled to the output stage; and a second transistor, having a gate terminal coupled to the first negative input terminal, a first source/drain coupled to the first controllable current source, and a second source/drain coupled to the output stage.

14. The sample-and-hold circuit as claimed in claim 13, wherein the first controllable current source comprises:

a second switch, having a first terminal couples to a second voltage, for transmitting the second voltage to a second terminal of the second switch in the second period, and switching off in the first period;

a first current source, having first terminal coupled to the second terminal of the second switch; and a second terminal of the first current source coupled to the first source/drain of the first transistor and the second transistor.

15. The sample-and-hold circuit as claimed in claim 11, wherein die second input stage further comprises:

a second controllable current source, for providing a current during the first period and not providing the current during the second period;

a fifth transistor, having a gate terminal coupled to the second positive input terminal, a first source/drain coupled to the second controllable current source, and a second source/drain coupled to the output stage; and a sixth transistor, having gate terminal coupled to the second negative input terminal, a first source/drain coupled to the second controllable current source, and a second source/drain coupled to the output stage.

16. The sample-and-hold circuit as claimed in claim 15, wherein the second controllable current source comprises:

a fifth switch, having a first terminal coupled to a fifth voltage, for transmitting the fifth voltage to a second terminal of the fifth switch in the first period, and switching off in the second period;

a third current source, having a first terminal coupled to the second terminal of the fifth switch; and a second terminal of the third current source coupled to the first source/drain of the fifth transistor and the sixth transistor.

17. The sample-and-hold circuit as claimed in claim 12, wherein the reference voltage can be a ground voltage or a power voltage.

18. The sample-and-hold circuit as claimed in claim 14, wherein the first voltage, the second voltage, the fourth voltage and the fifth voltage are a ground voltage.

19. The sample-and-hold circuit as claimed in claim 14, wherein the first voltage and the fourth voltage are a ground voltage, and the second voltage and the fifth. voltage are a power voltage.

20. The sample-and-hold circuit as claimed in claim 11, wherein the first input stage further comprises:

a third controllable current source, for providing a current during the second period and not providing the current during the first period;

a third transistor, having a gate terminal coupled to the first positive input terminal, a first source/drain coupled to the third controllable current source, and a second source/drain coupled to the output stage; and a fourth transistor, having a gate terminal coupled to the first negative input terminal, a first source/drain coupled to the third controllable current source, and a second source/drain coupled to the output stage.

21. The sample-and-hold circuit as claimed in claim 20, wherein the third controllable current source comprises:

a third switch, having a first terminal coupled to a third voltage, for transmitting the third voltage to a second terminal of the third switch in the second period, and switching off in the first period;

a second current source, having a first terminal coupled to the second terminal of the third switch; and a second terminal of the third current source coupled to the first source/drain of the third transistor and the fourth transistor.

22. The sample-and-bold circuit as claimed in claim 11, wherein the second input stage further comprises:

a fourth controllable current source, for providing a current during the first period and not providing the current during the second period;

a seventh transistor, having a gate terminal coupled to the second positive input terminal, a first source/drain coupled to the fourth controllable current source, and a second source/drain coupled to the output stage; and an eighth transistor, having a gate terminal coupled to the second negative input terminal, a first source/drain coupled to the fourth controllable current source, and a second source/drain coupled to the output stage.

23. The sample-and-hold circuit as claimed in claim 22, wherein the fourth controllable current source comprises:

a sixth switch, having first terminal coupled to a sixth voltage, for transmitting the sixth voltage to a second terminal of the sixth switch in the first period, and switching off in the second period;

a fourth current source, having a first terminal coupled to the second terminal of the sixth switch, and a second terminal of the fourth current source coupled to the first source/drain of the seventh transistor and the eighth transistor.

24. The sample-and-hold circuit as claimed in claim 21, wherein the first voltage, the second voltage, the fourth voltage and the fifth voltage are a ground voltage, and the third voltage and the sixth voltage are a power voltage.

25. The sample-and-hold circuit as claimed in claim 21, wherein the first voltage, the third voltage, the fourth voltage and the sixth voltage are a wound voltage, and the second voltage and the fifth voltage are a power voltage.

26. A sample-and-hold circuit, comprising:

a first switch, having a first terminal receiving an input signal, for transmitting the input signal to a second terminal of the first switch in a first period;

a fourth switch, having a first terminal receiving the input signal, for transmitting the input signal to a second terminal of the fourth switch in a second period;

a first capacitor, having a first terminal coupled to the second terminal of the first switch, a second terminal of the first capacitor coupled to a first voltage, for storing a first sampling result of the input signal;

a second capacitor, having a first terminal couples to the second terminal of the fourth switch, a second terminal of the second capacitor coupled to a fourth voltage, for storing a second sampling result of the input signal; and an amplifier, wherein the amplifier comprises:

a first positive input terminal, coupling to the second terminal of the first switch;

a second positive input terminal, coupling to the second terminal of the fourth switch;

a first negative input terminal;

a second negative input terminal;

an output terminal, coupling to the first negative input terminal and the second negative input terminal, for outputting an output signal in the first period according to the second sampling result, and outputting the output signal in the second period according to the first sampling result;

a first resistor, wherein a first terminal of the first resistor couples to the first negative input terminal and the second negative input terminal, a second terminal of the first resistor couples to the output terminal;

a first input stage, coupling to the first positive input terminal and the first negative input terminal, for outputting a first internal signal in the second period according to the signals of the first positive input terminal and the first negative input terminal, and stopping to output the first internal signal in the first period;

a second input stage, coupling to the second positive input terminal and the second negative input terminal, for outputting a second internal signal in the first period according to the signals of the second positive input terminal and the second negative input terminal, and stopping to output the second internal signal in the second period; and an output stage, for providing the output signal to the output terminal according to the first internal signal and the second internal signal.

27. The sample-and-hold circuit as claimed in claim 26, wherein the amplifier further comprises:
a second resistor, a first terminal of the second resistor coupling to the first negative input terminal and the second negative input terminal, a second terminal of the second resistor coupling to a reference voltage.

28. The sample-and-hold circuit as claimed in claim 26, wherein the first input stage comprises:
a first controllable current source, for providing a current during the second period and not providing the current during the first period;
a first transistor, having a gate terminal coupled to the first positive input terminal, a first source/drain coupled to the first controllable current source, and a second source/drain coupled to the output stage; and
a second transistor, having a gate terminal coupled to the first negative input terminal, a first source/drain coupled to the first controllable current source, and a second, source/drain coupled to the output stage.

29. The sample-and-hold circuit as claimed in claim 28, wherein the first controllable current source comprises:
a second switch, having a first terminal couples to a second voltage, for transmitting the second voltage to a second terminal of the second switch in the second period, and switching off in the first period;
first current source, having first terminal coupled to the second terminal of the second switch; and a second terminal of the first current source coupled to the first source/drain of the first transistor and the second transistor.

30. The sample-and-hold circuit as claimed in claim 26, wherein the second input stage further comprises:
a second controllable current source, for providing a current during the first period and not providing the current during the second period;
a fifth transistor, having a gate terminal coupled to the second positive input terminal, a first source/drain coupled to the second controllable current source, and a second source/drain coupled to the output stage; and
a sixth transistor, having gate terminal coupled to the second negative input terminal, a first source/drain coupled to the second controllable current source, and a second source/drain coupled to the output stage.

31. The sample-and-hold circuit as claimed in claim 30, wherein the second controllable current source comprises:
a fifth switch, having a first terminal coupled to a fifth voltage, for transmitting the fifth voltage to a second terminal of the fifth switch in the first period, and switching off in the second period;
a third current source, having a first terminal coupled to the second terminal of the fifth switch; and a second terminal of the third current source coupled to the first source/drain of the fifth transistor and the sixth transistor.

32. The sample-and-hold circuit tis claimed in claim 27, wherein the reference voltage can he a ground voltage or a power voltage.

33. The sample-and-hold circuit as claimed in claim 29, wherein the first voltage, the second voltage, the fourth voltage and the fifth voltage are a ground voltage.

34. The sample-and-hold circuit as claimed in claim 29, wherein the first voltage and the fourth voltage are a ground voltage, and the second voltage and the fifth voltage are a power voltage.

35. The sample-and-hold circuit as claimed in claim 26, wherein the first input stage further comprises:
a third controllable current source, for providing a current during the second period and not providing the current during the first period;
a third transistor, having a gate terminal coupled to the first positive input terminal, a first source/drain coupled to the third controllable current source, and a second source/drain coupled to the output stage; and
a fourth transistor, having a gate terminal coupled to the first negative input terminal, a first source/drain coupled to the third controllable current source, and a second source/drain coupled to the output stage.

36. The sample-and-hold circuit as claimed in claim 35, wherein the third controllable current source comprises:
a third switch, having a first terminal coupled to a third voltage, for transmitting the third voltage to a second terminal of the third switch in the second period, and switching off in the first period;
a second current source, having a first terminal coupled to the second terminal of the third switch; and a second terminal of the third current source coupled to the first source/drain of the third transistor and the fourth transistor.

37. The sample-and-hold circuit as claimed in claim 26, wherein the second input stage further comprises:
a fourth controllable current source, for providing a current during the first period and not providing the current during the second period;
a seventh transistor, having a gate terminal coupled to the second positive input terminal, a first source/drain coupled to the fourth controllable current source, and a second source/drain coupled to the output stage; and
an eighth transistor, having a gate terminal coupled to the second negative input terminal, a first source/drain coupled to the fourth controllable current source, and a second source/drain coupled to the output stage.

38. The sample-and-hold circuit as claimed in claim 37, wherein the fourth controllable current source comprises:
a sixth switch, having first terminal coupled to a sixth voltage, for transmitting the sixth voltage to a second terminal of the sixth switch in the first period, and switching off in the second period;

a fourth current source, having a first terminal coupled to the second terminal of the sixth switch, and a second terminal of the fourth current source coupled to the first source/drain of the seventh transistor and the eighth transistor.

39. The sample-and-hold circuit as claimed in claim 36, wherein the first voltage, the second voltage, the fourth voltage and the fifth voltage are a ground voltage, and the third voltage and the sixth voltage are a power voltage.

40. The sample-and-hold circuit as claimed in claim 36, wherein the first voltage, the third voltage, the fourth voltage and the sixth voltage are a ground voltage, and the second voltage and the fifth voltage are a power voltage.

* * * * *